(12) United States Patent
Nakahigashi

(10) Patent No.: US 6,838,174 B2
(45) Date of Patent: Jan. 4, 2005

(54) OBJECT BEING IN CONTACT WITH HUMAN SKIN WHEN USED

(75) Inventor: Takahiro Nakahigashi, Kyoto (JP)

(73) Assignee: Nissan Electric Co., Ltd., Kyoto (JP)

( * ) Notice: Subject to any disclaimer, the term of this patent is extended or adjusted under 35 U.S.C. 154(b) by 64 days.

(21) Appl. No.: 09/971,935

(22) Filed: Oct. 9, 2001

(65) Prior Publication Data

US 2002/0064657 A1 May 30, 2002

(30) Foreign Application Priority Data

Oct. 12, 2000 (JP) ........................................ 2000-311792

(51) Int. Cl.⁷ .............................................. C23C 14/06
(52) U.S. Cl. ................. 428/408; 4/604; 4/661; 30/345; 135/65; 414/921; 623/66.1; 623/924
(58) Field of Search .................. 428/408; 623/66.1, 623/924; 135/65; 30/345; 4/661, 604; 414/921

(56) References Cited

U.S. PATENT DOCUMENTS 5,192,523 A * 3/1993 Wu et al. ................... 423/446
5,427,826 A   6/1995 Iida
5,593,719 A * 1/1997 Dearnaley et al. .......... 427/525
5,846,649 A * 12/1998 Knapp et al. ................ 428/412
6,465,057 B1 * 10/2002 Nakahigashi et al. ....... 427/569

FOREIGN PATENT DOCUMENTS

| EP | 0 821 077 | * | 1/1998 |
| GB | 2287473 |   | 9/1995 |
| JP | 03130363 | * | 6/1991 |
| JP | 04041672 | * | 2/1992 |
| JP | 10-110257 |  | 4/1998 |
| JP | 11-18809 |   | 1/1999 |
| WO | 9954520 | * | 10/1999 |

* cited by examiner

*Primary Examiner*—Archene Turner
(74) *Attorney, Agent, or Firm*—Rader, Fishman & Grauer PLLC

(57) ABSTRACT

An object is provided, which has a portion to be in contact with a human's skin when used, and can suppress irritation of the human's skin. A skin-contact portion of the object to be in contact with the human's skin when used is coated with a carbon film. For example, the carbon-film-coated object is glasses having ear pieces of temples and node pads coated at least partially with carbon films having a function of suppressing skin irritation.

10 Claims, 6 Drawing Sheets

OBJECT BEING IN CONTACT WITH HUMAN SKIN WHEN USED

CROSS-REFERENCE TO RELATED APPLICATION

This application is based on Japanese patent application No. 2000-311792 filed in Japan on Oct. 12, 2000, the entire content of which is hereby incorporated by reference.

BACKGROUND OF THE INVENTION

1. Field of the Invention

The present invention relates to an object or article, which is in contact with a human skin when the object is used.

2. Description of Related Art

Some of objects or articles, which are used by human beings, are in contact with their skins when the objects are used.

Among them, there are objects, which may irritate or chap the human skin when the objects come into contact with the human's skin. In particular, the object is liable to irritate the skin if the skin-contact portion of the object, which is to be in contact with the human's skin, is made of a high polymer material such as rubber or resin.

From the above background, it is now demanded to provide the object, which can suppress skin irritation due to contact of the object with the skin.

SUMMARY OF THE INVENTION

An object of the invention is to provide an object responding to the above request, and particularly an object, which has a portion to be in contact with a human's skin when used, and can suppress irritation of the human's skin.

The inventor has made studies for achieving the above object, and found the followings.

In the object having a skin-contact portion, which is in contact with a human's skin when used, the skin-contact portion may be covered at least partially with a carbon film, whereby the object can provide better smoothness when touched with the human's skin. Further, the object can be less irritating to the skin and can provide good feeling to the skin so that irritation of the human's skin can be suppressed. Further, a diamond-like carbon film may be used as the carbon film for covering at least a portion of the skin-contact portion. Thereby, the effect of suppressing the skin irritation can be further improved.

The invention is based on the above findings, and provides, for achieving the above object, a carbon-film-coated object having a skin-contact portion to be in contact with a human's skin when used, and including a carbon film covering at least a portion of the skin-contact portion and having a function of suppressing skin irritation.

According to the carbon-film-coated object of the invention, since at least a portion of the skin-contact portion is coated with the carbon film having the skin irritation suppressing function, the object can provide better smoothness when touched with the human's skin. Further, the object can be less irritating to the skin and can provide good feeling to the skin so that irritation of the human's skin can be suppressed.

The foregoing and other objects, features, aspects and advantages of the present invention will become more apparent from the following detailed description and the accompanying drawings.

DESCRIPTION OF THE PREFERRED EMBODIMENTS

Figure 1:
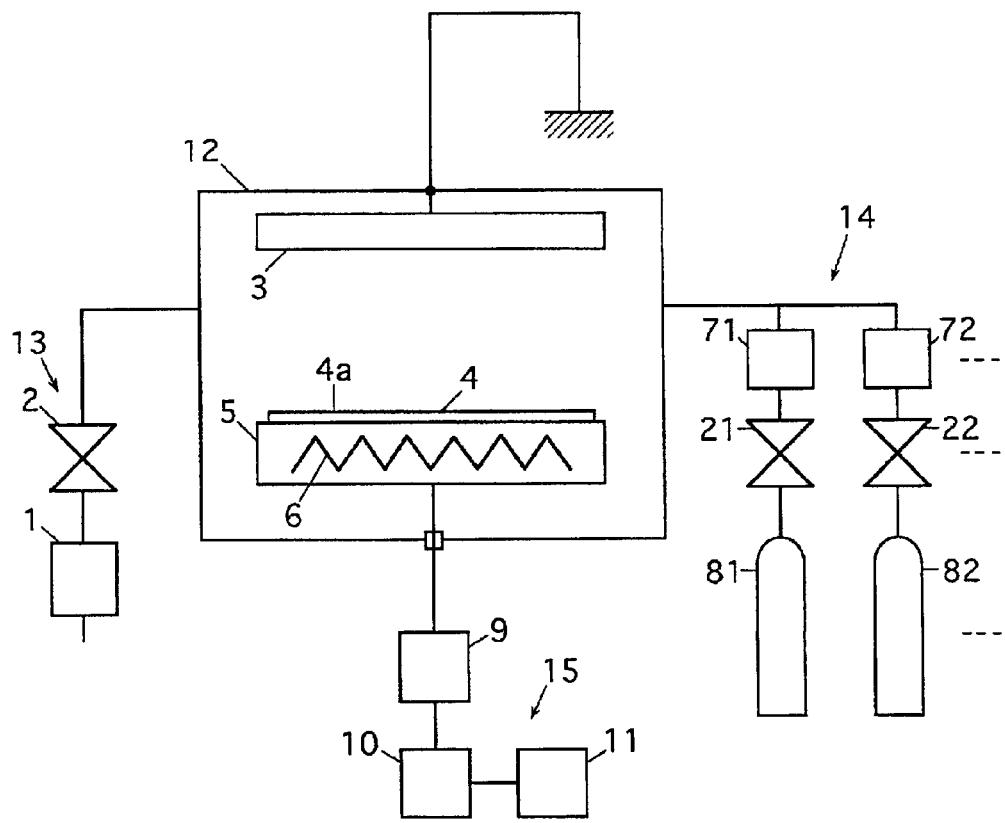
FIG. 1 shows a schematic structure of an example (parallel-plate RF plasma CVD device) of a deposition device, which can be used for producing a carbon-film-coated object to be in contact with a human's skin when used.

An object of an embodiment of the invention is basically an object, which is in contact with a human's skin when the object is used, and particularly is a carbon-film-coated object having a skin-contact-portion. This skin-contact-portion is in contact with the human's skin when used, and is at least partially coated with a carbon film having a function of suppressing skin irritation.

In this carbon-film-coated object, since the skin-contact-portion is coated at least partially with the carbon film having the function of suppressing skin irritation, the object can provide better smoothness when touched with the human's skin. Further, the object can be less irritating to the skin and can provide good feeling to the skin so that irritation of the human's skin can be suppressed.

The object, which is in contact with the human's skin when used, can be selected from many and various objects and, for example, may be a welfare object such as a nursing or caring object in view of the fact that the nursing or caring objects are in contact with the human's skins in many cases. If the invention is applied to the welfare object such as nursing or caring objects, an effect of suppressing skin irritation can be expected because the nursing or caring objects are brought into contact with the human's skins in relatively many cases.

The welfare object (caring object) is an object, which is used for supporting or assisting, e.g., a handicapped person to do various actions and others in the daily life by himself/herself to a largest extent. For example, by using the welfare object, a self-supporting life range of a person such as a handicapped person can be increased, and/or it is possible to reduce a labor required in the families nursing or caring the handicapped person. Such objects may be (a) an object for allowing excretion without a help or for helping it, (b) an object for allowing bathing without a help or for for helping it, (c) an object for preventing a bedsore, (d) an object for allowing movement without a help or for helping it, (e) an object for allowing eating without a help or for helping it, (f) a convenient good for daily use, and (g) prosthetic device.

The following portions may be the skin-contact-portions of the welfare object (caring object).

(a) The skin-contact portions of the object for allowing excretion without a help or for helping it may be a skin-contact portion of a handrail of a toilet, a skin-contact portion of a toilet seat, a skin-contact portion of a height-adjusting toilet seat, a skin-contact portion of a toilet seat set including larger and smaller seats, a skin-contact portion of a toilet seat with a hot-water washer, a skin-contact portion of a urine collector, a skin-contact portion of a portable toilet and a skin-contact portion of an insertable toilet.

(b) The skin-contact portions of the objects for allowing bathing without a help or for helping it are a skin-contact portion of a handrail for a bathroom, a skin-contact portion of a bathtub, a skin-contact portion of a simple handrail for a bathtub, a skin-contact portion of a shower chair, a skin-contact portion of a bath board, a skin-contact portion of a shampoo hat and a skin-contact portion of a bath chair (bath step).

(c) The skin-contact portions of the objects for preventing a bedsore are a skin-contact portion of a motor-operated nursing bed, a skin-contact portion of a hand-operated nursing bed, a skin-contact portion of a bed side-rail, a skin-contact portion of a heel cushion, a skin-contact portion of a bed table, a skin-contact portion of an assistant bar, a skin-contact portion of an air mat and a skin-contact portion of a body position changing tool.

(d) The skin-contact portions of the objects for allowing movement without a help or for helping it are a skin-contact portion of a walking stick, a skin-contact portion of a walking support cart, e. g., for the aged person, a skin-contact portion of a walker, a seat of a wheel chair, a handle of a wheel chair, a footrest of a wheel chair, a sidewall of a tire of a wheel chair, a skin-contact portion of an elevator for a wheel chair, a skin-contact portion of a mat provided on a wheel chair for preventing a bedsore, a skin-contact portion of a transfer lift, a skin-contact portion of an overhead transfer lift and a skin-contact portion of a stair ascender.

(e) The skin-contact portions of the objects for allowing eating without a help or for helping it are skin-contact portions of a spoon and a fork with holders, skin-contact portions of a spoon and a fork with grips, skin-contact portions of a bent spoon and a bent fork, skin-contact portions of a spoon and a fork having shape memory properties, a skin-contact portion of a cup with a hand grip and a skin-contact portion of a knife with a hand grip.

(f) The skin-contact portions of convenient goods for daily use are earpieces of temples of glasses, nose pads of the glasses and a skin-contact portion of a lever of a spout or cock.

(g) The skin-contact portions of the prosthetic devices are skin-contact portions of artificial leg and arm, a skin-contact portion of a standing protector, a skin-contact portion of a head protector and a skin-contact portion of a head protection cap.

In addition to the above, medical goods may be the object to be in contact with the human skin when used according to the invention. The skin-contact portion of the medical object may be a skin-contact portion of a neck holder of a pulling treatment unit used for a pulling treatment for whiplash injury or the like.

In any one of the above cases, the carbon film is not specifically restricted provided that it has a function of preventing skin irritation, and may be, e.g., a DLC (Diamond Like Carbon) film.

The diamond like carbon (which will be referred to as "DLC" hereinafter) film can improve an effect of suppressing skin irritation. The DLC film can provide good water repellency. Accordingly, the object portion coated with the DLC film has good water repellency. If the object portion to be coated must have flexibility, such a DLC film having hardness, which can suppress damages, as well as flexibility can be used. The DLC film can be formed at a relatively low temperature. For this reason and others, the deposition thereof can be easy, In any one of the above cases, the carbon film desirably has a thickness, which allows close and intimate contact with the object portion to be coated, and can prevent a damage, if occurs, from reaching the object.

In any one of the above cases, the object portion coated with the carbon film may be formed of a high polymer material. This high polymer material may be rubber and/or resin.

The rubber may be natural rubber, butyl rubber, ethylene-propylene rubber, chloroprene rubber, chlorinated polyethylene rubber, epichlorohydrin rubber, acrylic rubber, nitrile rubber, urethane rubber, silicone rubber, fluororubber or the like. The resin may be either thermoplastic resin, thermosetting resin, a combination of thereof, or the like.

For producing the carbon-film-coated object, such a pretreatment may be performed on the object portion (which may also be referred to as a "object base member" hereinafter) to be coated with the carbon film prior to the carbon film formation that the film formation surface of the base member is exposed to the plasma of at least one of the fluorine (F) containing gas, hydrogen ($H_2$) gas and oxygen ($O_2$) gas. In this case, the object base member of the object is subjected to the above pretreatment.

The above fluorine-containing gas may be a fluorine ($F_2$) gas, a nitrogen trifluoride ($NF_3$) gas, a sulfur hexafluoride ($SF_6$) gas, a carbon tetrafluoride ($CF_4$) gas, a silicon tetrafluoride ($SiF_4$) gas, a disilicon hexafluoride ($Si_2F_6$) gas, a chlorine trifluoride ($ClF_3$) gas, a hydrogen fluoride (HF) gas or the like.

By exposing the object base member to the plasma of the pretreatment gas, the base member surface is cleaned, and the surface roughness of the base member is improved. These contribute to improvement of the adhesion of the carbon film so that the carbon film having high adhesion can be obtained.

If the object base member has the film formation surface made of an organic material such as resin or rubber, and the fluorine containing gas plasma is employed for the pretreatment, the plasma terminates the base member surface with the fluorine. If the hydrogen gas plasma is employed, the plasma terminates the base member surface with the hydrogen. Since the fluorine-carbon coupling and the hydrogen-carbon coupling are stable, the carbon atoms in the film form stable coupling with the fluorine atoms or hydrogen atoms at the surface portion of the base member when subjected to such termination. This improves the adhesion of the carbon film, which will be formed later, to the base member.

When employing the oxygen gas plasma, smear due to, e.g., organic matters adhering to the base member surface can be removed particularly effectively so that the adhesion of the carbon film, which will be formed subsequently, to the base member can be improved.

Prior to the formation of the carbon film, the pretreatment using plasma may be performed on the base member several times with the same kind of plasma or with different kinds of plasma. For example, if the base member is exposed to the fluorine-containing gas plasma or hydrogen gas plasma after exposing the base member to the oxygen gas plasma, and the carbon film is subsequently deposited thereon, the fluorine or hydrogen termination is performed at the surface after the surface is cleaned so that the carbon film deposited thereafter has a very good adhesion to the base member surface.

The carbon film forming method such as plasma CVD, sputtering, ion plating or the like may be employed as a method, in which the film formation can be performed at a temperature range not thermally damaging the base member made of a material such as rubber or resin having a relatively low heat resistance. Particularly, the plasma CVD method can provide such an advantage that the same device can be used for the pretreatment of the deposition target with plasma and the carbon film formation.

The deposition material gas (plasma material gas for film deposition), which can be employed for forming the carbon film in the plasma CVD method, may be a carbon compound gas such as a gas-of methane ($CH_4$), ethane ($C_2H6$), propane ($C_3H_8$), butane ($C_4H_{10}$), acetylene ($C_2H_2$), benzene ($C_6H_6$), carbon tetrafluoride ($CF_4$) or dicarbon hexafluoride ($C_2F_6$), which is generally used for carbon film formation, and the material gas may be a mixture of the above hydrocarbon compound gas and a carrier gas such as a hydrogen gas, an inert gas or the like, if necessary.

Specific examples of the object according to the invention will now be described.

Figure 3A:
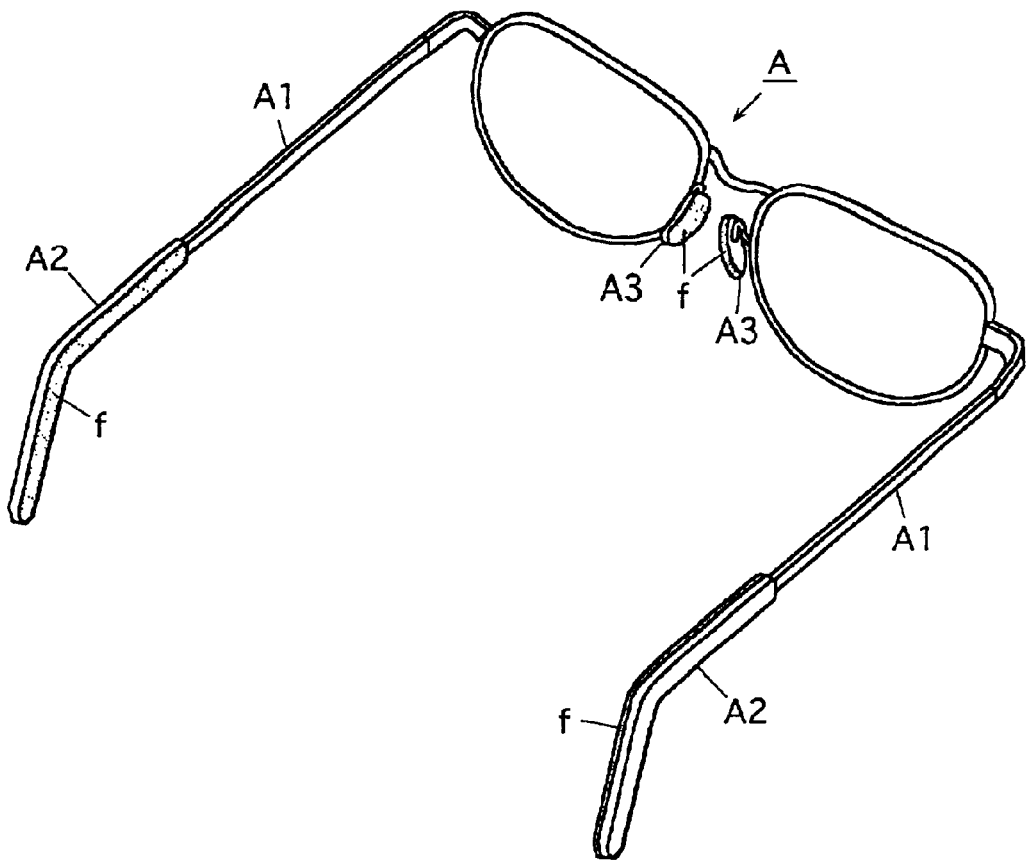
FIG. 3(A) is a perspective view of an example (glasses) of the carbon-film-coated object to be in contact with a human's skin when used.
Figure 3B:
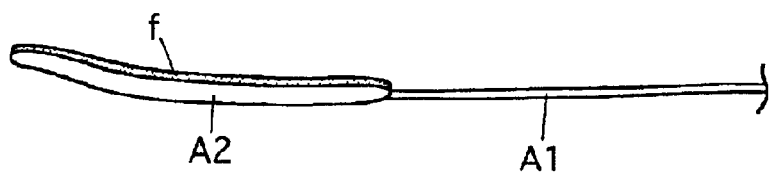
FIG. 3(B) is a plan of a portion of a temple of the glasses shown in FIG. 3(A)
Figure 3C:
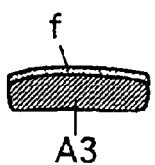
FIG. 3(C) is a cross section of a nose pad of the glasses shown in FIG. 3(A).

FIG. 1 shows a schematic structure of an example (parallel-plate RF plasma CVD device) of a deposition device, which can be used for producing a carbon-film-coated object to be in contact with a human's skin when used. FIG. 3(A) is a perspective view of an example (glasses A) of the carbon-film-coated object to be in contact with a human's skin when used, FIG. 3(B) is a plan of a portion of a temple A1 of the glasses A shown in FIG. 3(A), and FIG. 3(C) is a cross section of a nose pad A3 of the glasses shown in FIG. 3(A).

A device shown in FIG. 1 has a vacuum chamber (film deposition chamber) 12 connected to a vacuum device 13 and a gas supply portion 14.

The vacuum device 13 has a vacuum pump 1 and a pressure control value 2. The vacuum pump 1 can discharge a gas from the chamber 12 to produce a vacuum. The pressure control valve 2 is arranged between the vacuum pump 1 and the chamber 12, and can adjust the predetermined internal pressure of the chamber 12, from which a gas is discharged by the vacuum pump 1, to a predetermined deposition pressure.

The gas supply portion 14 can supply a plasma material gas for film deposition and others into the chamber 12. The gas supply portion 14 includes one or more plasma material gas cylinders (i.e., gas cylinders for the deposition process) 81, 82, . . . . The process gas cylinders 81, 82, . . . are connected to the chamber 12 via MFCs (Mass-Flow Controllers) 71, 72, . . . and pressure control valves 21, 22, . . . . The MFCs 71 and 72 can control the flow rate of the gas, which is supplied into the chamber 12, to a predetermined value.

In the chamber 12, there are arranged an RF electrode 5 and a ground electrode 3 opposed to the electrode 5. The electrode 3 is grounded. The electrode 5 can support an object base member 4, which is to be in contact with a human's skin when the member 4 is used.

The electrode 5 is connected to an RF power source 15, which includes an RF amplifier 10 and an arbitrary waveform generating device 11, via a matching box 9. Thereby, the RF power source 15 can supply an RF (radio-frequency) power to the electrode 5 via the matching box 9, whereby gas plasma can be produced between the ground electrode 3 and the RF electrode 5. A heater 5 is arranged on the electrode 5 for heating the deposition target base member 4 to a deposition temperature.

By using the above device, the carbon-film-coated object is produced through the following process.

(1) Pretreatment is performed with the plasma in the following manner prior to the carbon film deposition.

The object base member 4, which comes into contact with a human's skin when used, has a contact surface 4a for contact with the human's skin, and the member 4 is disposed on the electrode 5 with the surface 4a opposed to the electrode 3. The vacuum pump 1 operates to keep a predetermined deposition pressure in the chamber 12, and at the same time, the gas supply portion 14 supplies into the chamber 12 the pretreatment gas including at least one of the fluorine-containing gas, hydrogen gas and oxygen gas. Also, the RF power source 15 supplies the RF power to the electrode 5 via the matching box 9. Thereby, the plasma is produced from the pretreatment gas thus supplied, and the surface treatment is effected on the base member 4 under the plasma. The surface treatment (pretreatment) may be performed several times with the same kind of plasma or different kinds of plasma. Although this surface treatment (pretreatment) is desired, but is not essential.

(2) The carbon film is formed by the following process.

Then, the pretreatment gas is discharged from the chamber 12. Thereafter, the gas supply portion 14 supplies the deposition material gas, i.e., carbon compound gas into the chamber 12 while maintaining the carbon film deposition pressure in the chamber 12 by the vacuum device 13. Also, the RF power source 15 supplies an RF power to the electrode 5 so that the plasma is. produced from the carbon compound gas, and the carbon film is formed on the base member surface 4a under the plasma.

The above process produce the carbon-film-coated object, which is to be in contact with the human's skin when used, and has at least a portion provided substantially uniformly with the carbon film having the function of suppressing the skin irritation. More specifically, in the example shown in FIG. 3, the above process produces glasses A, in which at least a portion of skin-contact portions of ear pieces A2 of temples A1 and node pads A3 are substantially uniformly provided with carbon films f having a function of suppressing the skin irritation. The ear piece A2 and the nose pad A3 are subjected to the processing of forming the carbon films independently of each other, and then are attached to lens frames.

Depending on the skin-contact portion of the object, the following manner may be employed, if necessary. During the pretreatment and the deposition of the object base member, a portion of, e.g., the base member is kept in electrical contact with the electrode 5. Rotation drive means (not shown) rotates the base member alone or together with the electrodes, and/or a portion of the base member, which is not to be coated with the film, is covered with mask means. While keeping this state, the surface treatment and the deposition are performed substantially uniformly on the outer surface of the base member to be in contact with the human's skin.

Figure 2:
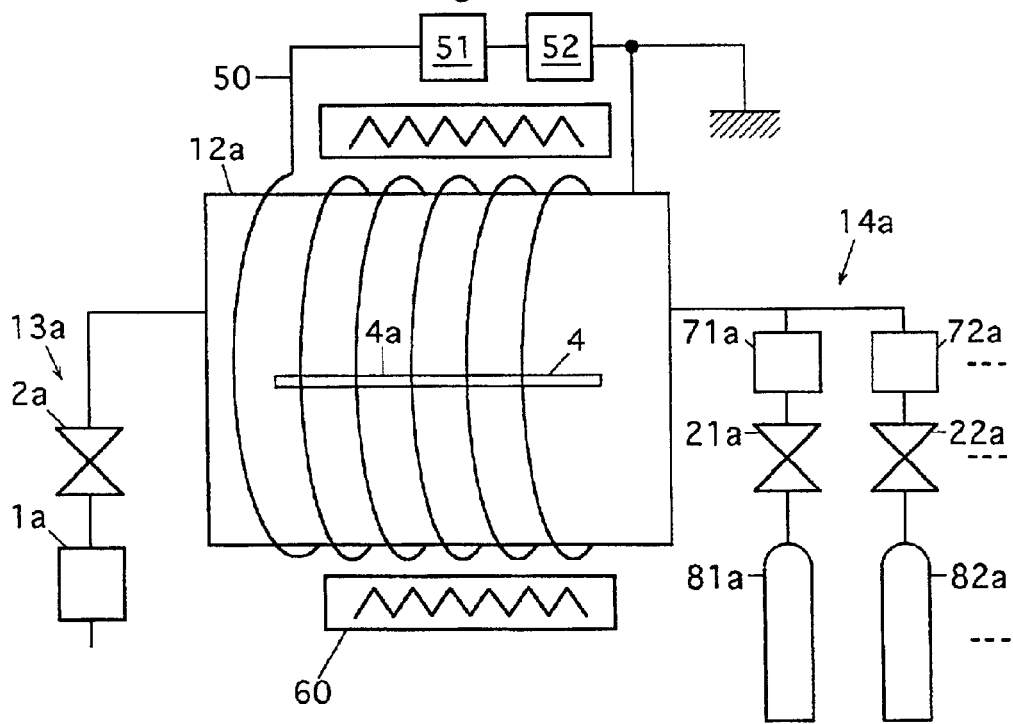
FIG. 2 shows a schematic structure of another example (inductive coupling plasma CVD device) of a deposition device, which can be used for producing a carbon-film-coated object to be in contact with a human's skin when used.

For producing the carbon-film-coated object, a deposition device in FIG. 2 may be used instead of the device in FIG. 1. The device in FIG. 2 can efficiently form the film on the surface of the base member even if the base member has a three-dimensional structure.

The device in FIG. 2 is a plasma CVD device of an inductive coupling type, and has a vacuum container 12a. An induction coil electrode 50 is wound around the container 12a, and the opposite ends of the electrode 50 are connected to a matching box 51 and an RF power source 52. A heater 60 for heating the deposition target base member 4 to the deposition temperature is arranged outside the vacuum container 12a.

The vacuum container 12a is connected to a vacuum device 13a via a piping, and is also connected to a gas supply portion 14a of the deposition material gas. The vacuum device 13a includes a vacuum pump 1a and a pressure control valve 2a. The gas supply portion 14a includes one or more gas cylinders 81a, 82a, . . . for supplying the plasma material gas such as a deposition material gas. The process gas cylinders 81a, 82a, . . . are connected via MFCs 71a, 72a, . . . and valves 21a, 22a, . . .

For forming the carbon-film-coated object by the above device, the surface treatment and the carbon film formation are performed in the same manners as the surface treatment and the carbon film formation for the object base member 4 by the device shown in FIG. 1 except for that the plasma is formed from the material gas by applying an RF power to the inductive coil electrode 50. In this case, the surface treatment (pretreatment) is desired, but is not essential.

According to the carbon-film-coated object thus produced, at least a portion of the skin-contact portion is coated with the carbon film having the function of suppressing the skin irritation. Therefore, the object can provide dry feeling when the object comes into contact with the human's skin, can provide good touch feeling with less irritation, and can suppress the skin irritation.

Another example of the carbon-film-coated object, which comes into contact with the human's skin when used, will now be described with reference to FIGS. 4 to 14.

Figure 4:
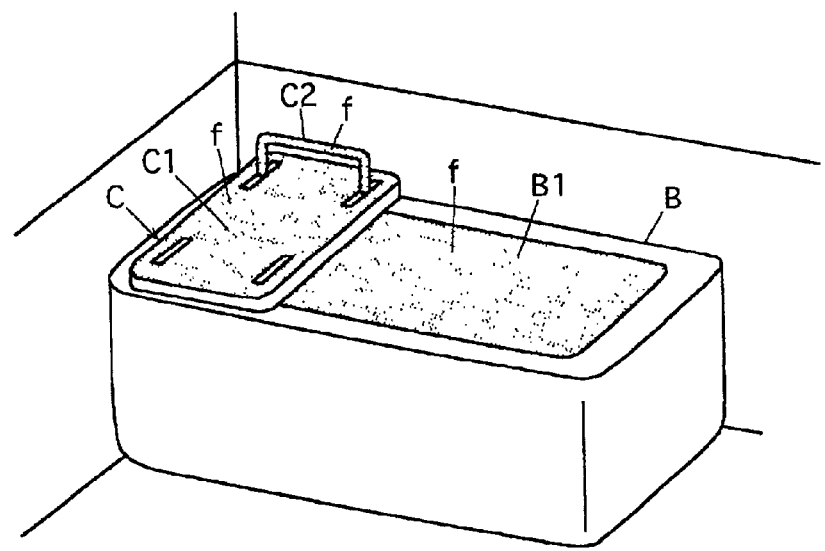
FIG. 4 shows another example of the carbon-film-coated object, and more specifically shows a bathtub and a bath board.

FIG. 4 is a perspective view of a bathtub B and a bath board C, which can be used as a seat or chair, e.g., instead of a narrow edge of the bathtub B. An inner surface B1 of the bathtub B shown in FIG. 4 is coated with the carbon film f having the function of suppressing the skin irritation. The bath board C has a seat portion C1 and a hand rail C2, which are coated with the carbon films f.

Figure 5:
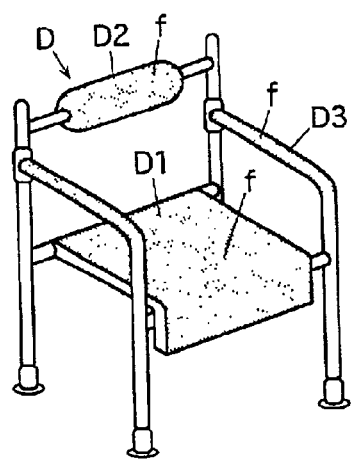
FIG. 5 is a perspective view showing a shower chair, which is further another example of the carbon-film-coated object.

FIG. 5 is a perspective view of a shower chair D used, e.g., when having a shower. The shower chair D shown in FIG. 5 has a seat D1, a back D2 and arm rests D3, which are coated with the carbon films f.

Figure 6:
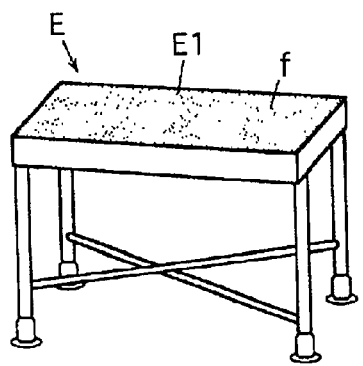
FIG. 6 is a perspective view showing a bath chair, which is further another example of the carbon-film-coated object.

FIG. 6 is a perspective view of a bath chair E, which is placed in a bathtub for use as a seat, or is placed on a floor of a bathroom, e.g., for a step. The bath chair E shown in FIG. 6 has a seat portion E1 coated with the carbon film f.

Figure 7:
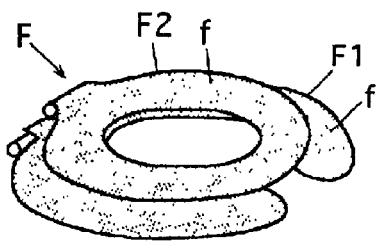
FIG. 7 is a perspective view showing a toilet seat set, which is further another example of the carbon-film-coated object.

FIG. 7 is a perspective view showing a toilet seat set F, which is used for stably supporting a hip during excretion. The toilet seat set F shown in FIG. 7 has larger and smaller seats F1 and F2, which are coated with the carbon films f.

Figure 8:
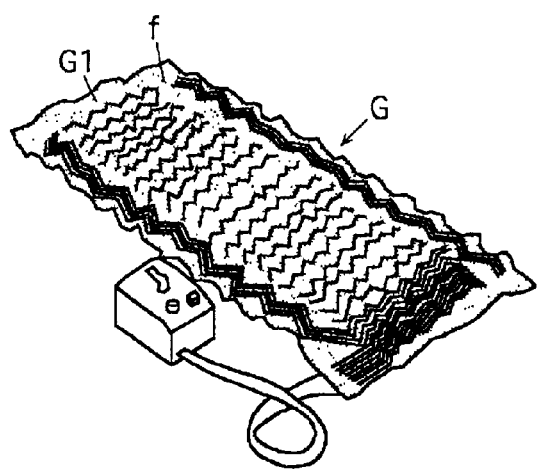
FIG. 8 is a perspective view showing an air mattress, which is further another example of the carbon-film-coated object.

FIG. 8 is a perspective view of an air mat G, which can pneumatically disperse a body pressure, e.g., for preventing a local pressure to the same portion of a human body. The air mat G shown in FIG. 8 has an outer surface G1 coated with the carbon film f.

Figure 9:
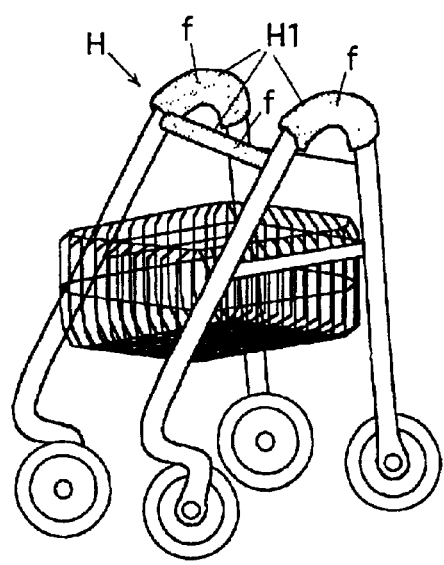
FIG. 9 is a perspective view showing a walking support cart for an old person, which is further another example of the carbon-film-coated object.

FIG. 9 is a perspective view showing a walking support cart H, which is used, e.g., for supporting or assisting walking of a person such as an aged person. The walking support car H shown in FIG. 9 has grips H1, which are coated with the carbon films f.

Figure 10:
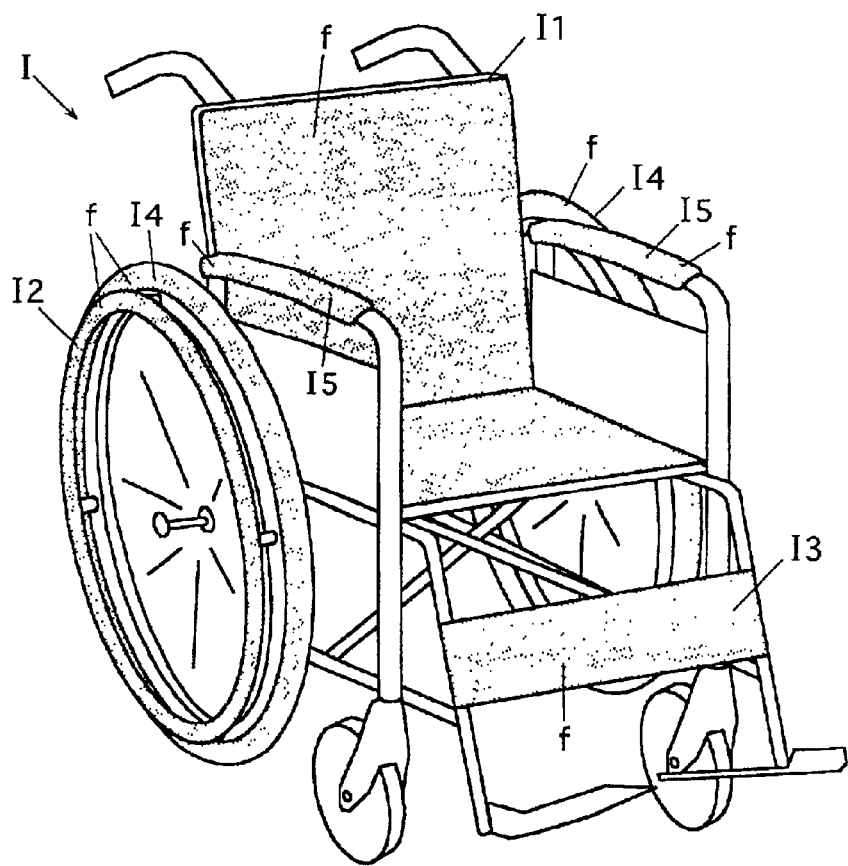
FIG. 10 is a perspective view showing a wheel chair, which is further another example of the carbon-film-coated object.

FIG. 10 is a perspective view showing a wheel chair I. The wheel chair I shown in FIG. 10 has a seat I1, push rims I2, a footrest I3, tire sidewalls I4 and arm rests I5, which are coated with the carbon films f.

Figure 11:
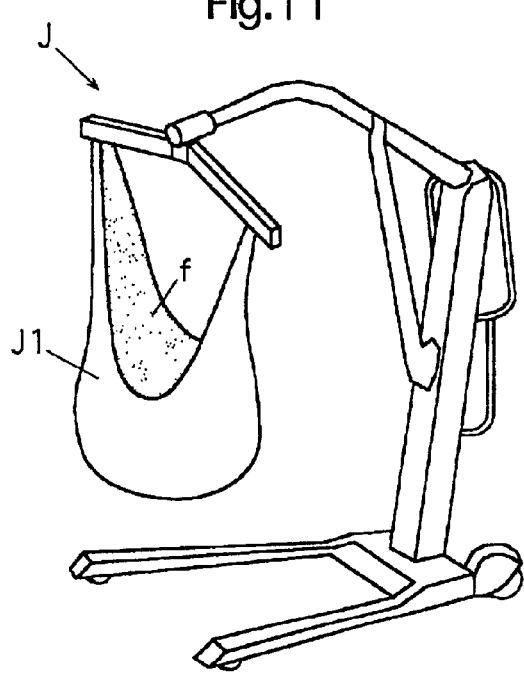
FIG. 11 is a perspective view showing a transfer lift, which is further another example of the carbon-film-coated object.

FIG. 11 is a perspective view showing a transfer lift J, which is used, e.g., for transfer or movement of the person from a bed to a wheel chair, or from a wheel chair to a toilet seat. The transfer lift J shown in FIG. 11 has a transfer portion J1, of which inner surface is coated with the carbon film f.

Figure 12A:
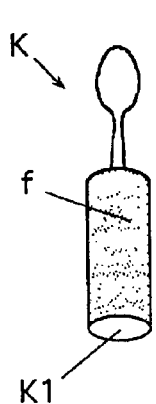
FIGS. 12(A) and 12(B) are perspective views showing further different examples of the carbon-film-coated object, which are a spoon with a grip, and a fork with a grip, respectively.
Figure 12B:
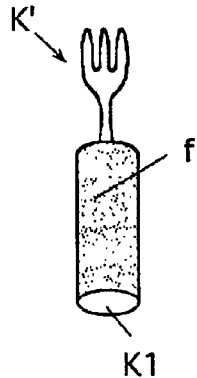
Figure 13A:
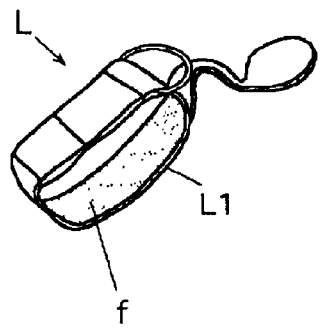
FIGS. 13(A) and 13(B) are perspective views showing further different examples of the carbon-film-coated object, which are a spoon with a holder and a fork with a holder, respectively.
Figure 13B:
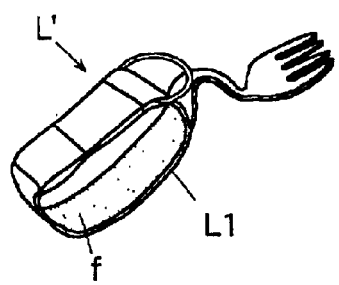

FIGS. 12(A) and 12(B) are perspective views showing a spoon K with a grip K1 and a fork K' with a grip K1, respectively. FIGS. 13(A) and 13(B) are perspective views showing a spoon L with a holder L1 and a fork L' with a holder L1, respectively. These grips K1 and the holders L1 are coated with the carbon films f.

Figure 14:
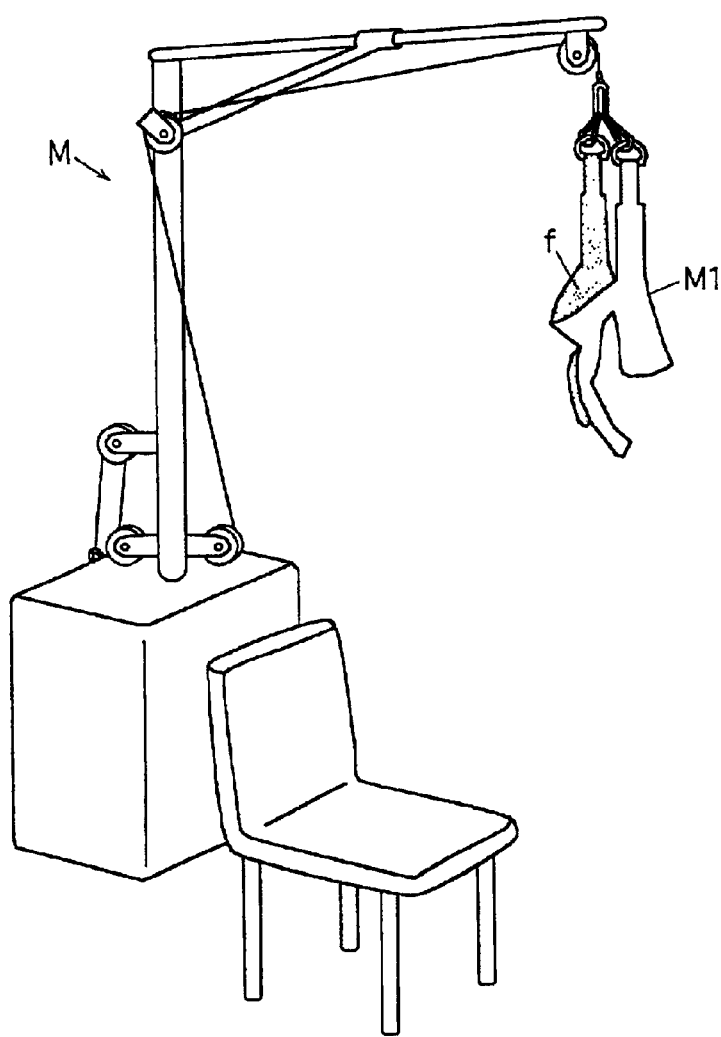
FIG. 14 is a perspective view showing a medical pulling treatment device, which is further another example of the carbon-film-coated object.

FIG. 14 is a perspective view showing a medical pulling treatment device M used for a pulling treatment unit for whiplash injury or the like. The pulling treatment device M shown in FIG. 14 has a neck holder unit M1, of which inner surface is coated with the carbon film f.

Description will now be given on experimental examples 1–5, in which the device shown in FIG. 1 was used, and flexible DLC films F were formed on surfaces of test pieces made of silicon rubber. The silicon rubber has been used as a material of objects, which are in contact with human's skins when used.

EXPERIMENTAL EXAMPLE 1

In the experimental example 1, a pretreatment was not performed before formation of the DLC film.

Test piece material: silicon rubber

Test piece sizes: 20 cm×20 cm×1 cm (thickness)

Size and form of RF electrode 5: 40 cm ×40 cm (square)

Deposition Conditions:

Deposition material gas: methane ($CH_4$) gas, 100 sccm

RF power: frequency 13.56 MHz, 300 W

Deposition pressure: 13.3 Pa (0.1 Torr)

Deposition rate: 500 Å/minute

Deposition temperature: 80° C.

Deposition time: 20 minutes

EXPERIMENTAL EXAMPLE 2

In the experimental example 2, a pretreatment with hydrogen gas plasma was performed prior to the formation of the DLC film. The material and size of the test piece, the size of the RF electrode and the deposition conditions were the same as those in the experimental example 1.

Pretreatment Conditions

Pretreatment gas: hydrogen ($H_2$), 100 sccm

RF power: frequency 13.56 MHz, 300 W

Treatment pressure: 13.3 Pa (0.1 Torr)

Treatment time: 5 minutes

EXPERIMENTAL EXAMPLE 3

In the experimental example 3, a pretreatment with fluorocarbon compound gas plasma was performed prior to the formation of the DLC film. The material and size of the test piece, the size of the RF electrode and the deposition conditions were the same as those in the experimental example 1.

Pretreatment Conditions

Pretreatment gas: sulfur hexafluoride ($SF_6$), 100 sccm

RF power: frequency 13.56 MHz, 300 W

Treatment pressure: 13.3 Pa (0.1 Torr)

Treatment time: 5 minutes

EXPERIMENTAL EXAMPLE 4

In the experimental example 4, a first pretreatment with oxygen gas plasma was performed and then a second pretreatment with hydrogen gas plasma was performed prior to the formation of the DLC film. The material and size of the test piece, the size of the RF electrode and the deposition conditions were the same as those in the experimental example 1.

First Pretreatment Conditions

Pretreatment gas: Oxygen ($O_2$), 100 sccm

RF power: frequency 13.56 MHz, 300 W

Treatment pressure: 13.3 Pa (0.1 Torr)

Treatment time: 5 minutes

Second Pretreatment Conditions

Pretreatment gas: Hydrogen ($H_2$), 100 sccm

RF power: frequency 13.56 MHz, 300 W

Treatment pressure: 13.3 Pa (0.1 Torr)

Treatment time: 5 minutes

EXPERIMENTAL EXAMPLE 5

In the experimental example 5, a first pretreatment with oxygen gas plasma was performed and then a second pretreatment with fluorocarbon compound gas plasma was performed prior to the formation of the DLC film. The material and size of the test piece, the size of the RF electrode and the deposition conditions were the same as those in the experimental example 1.

First Pretreatment Conditions

Pretreatment gas: Oxygen ($O_2$) 100 sccm

RF power: frequency 13.56 MHz, 300 W

Treatment pressure: 13.3 Pa (0.1 Torr)

Treatment time: 5 minutes

Second Pretreatment Conditions

Pretreatment gas: sulfur hexafluoride ($SF_6$), 100 sccm

RF power: frequency 13.56 MHz, 300 W

Treatment pressure: 13.3 Pa (0.1 Torr)

Treatment time: 5 minutes

Then, evaluation was made on touch feeling and skin irritation of each of the DLC-film-coated objects, which were produced in the experimental examples 1–5, as well as similar test pieces not provided with the DLC film.

The touch feeling was evaluated based on touch tests by twenty adults. Each evaluation was made based on the following five criteria, and the total evaluation was made based on the averages of the results.

5: dry and smooth, and not sticky

4: dry and smooth, but slightly sticky

3: somewhat dry and smooth, and somewhat sticky

2: much sticky, and deficient in dry and smooth feeling

1: much sticky, and very deficient in dry and smooth feeling

The skin irritation was evaluated by adhering a portion of each test piece to an inner side of an upper arm of the adult. This adhesion was effected on twenty adults, and skin conditions of them were measured after 24 hours. The evaluation was made based on the following three criteria:

O: In 90% or more of the adults, the skins did not change into red.

Δ: In 50% or more of the adults, the skins did not change into red.

X: In 90% or more of the adults, the skins chang into red.

The results are as follows:

|  | Touch Feeling (average of 5 criteria) | Skin Irritation (average of 3 criteria) |
| --- | --- | --- |
| C/E* | 1.5 | X |
| E/E*1 | 4.2 | Δ |
| E/E 2 | 4.4 | O |
| E/E 3 | 4.5 | O |
| E/E 4 | 4.6 | O |
| E/E 5 | 4.6 | O |

C/F*: comparative example
E/E*: experimental example

As can be seen from the above, the test pieces 1–5 coated with the DLC films, which were produced in the experimental examples 1–5, can provide better touch feeling and skin irritating properties than the test piece of the comparative example.

Then, the friction coefficient and wear characteristics of the DLC-film-coated objects produced in the foregoing experimental examples 1–5 were compared with those of the test pieces, which are the same as those of the experimental examples except for that the DLC film is not formed. Also, the film adhesion of the DLC-film-coated objects obtained in the foregoing experimental examples 1–5 was determined.

The friction coefficients were measured with a pin-like member, which is made of aluminum, and has an end of 5 mm in radius R. The pin-like member was kept in contact with the test piece surface under a load of 10 grams, and was moved at a speed of 20 mm/sec. In this manner, the values were measured.

The friction characteristics were measured with a pin-like member, which is made of diamond, and has an end of 5 mm in radius R. The pin-like member was kept in contact with the test piece surface under a load of 100 grams, and was moved at a speed of 20 mm/sec along a circle of 20 mm in radius for one hour. Then, the depths of the worn portions were measured.

The film adhesion was evaluated in a pulling jig method using a columnar member of 5 mm in diameter made of stainless steel (SUS 304). This member was joined to the DLC film with adhesive, and then was pulled perpendicularly to the film for separating or peeling off the film from the test piece body. The forces required for this separation were measured for evaluation.

The results are as follows.

|      | FR/CO* | FR/CH* | FL/AD* |
|------|--------|--------|--------|
| C/E* | 4      | 2.5    | —      |
| E/E*1| 1      | 0.9    | 2      |
| E/E 2| 1      | 0.7    | 4      |
| E/E 3| 1      | 0.7    | 4      |
| E/E 4| 1      | 0.5    | 5      |
| E/E 5| 1      | 0.5    | 5      |

C/F*: comparative example
E/E*: experimental example
FR/CO*: friction coefficient
FR/CH*: friction characteristics (worn depth ($\mu$m))
FL/AD*: film adhesion (film adhesion strength (N))

As described above, the test pieces of the experimental examples 1–5 coated with the DLC films exhibit smaller friction coefficients and better wear resistance than the test piece of the comparative example. Further, the test pieces of the experimental examples 2–5, which were coated with the DLC films and were subjected to the pretreatment with plasma before the DLC film formation, exhibit better film adhesion than the test piece of the experimental example 1, which was coated with the DLC film but was not subjected to the pretreatment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An object to be in contact with a human's skin when used, comprising:
   an object base member having a film formation surface exposed to a pretreatment gas that cleans the film formation surface and enhances surface roughness for carbon film adhesion, the pretreated film formation surface coated with a carbon film adhering thereto and having a function of suppressing skin irritation, the carbon film having a friction coefficient of 1 or less and a film adhesion strength of at least 2 N, wherein the friction coefficient is measured with an aluminum pin having an end of 5 mm in radius, the pin being in contact with the carbon film under a load of 10 grams and moved at a speed of 20 mm per second, wherein said object to be in contact with the human's skin when used is a welfare object for a handicapped person selected from a group consisting of an object for allowing or helping excretion, an object for allowing or helping eating, an object for allowing or helping bathing, an object for preventing a bedsore, an object for allowing or helping movement and a prosthetic object.

2. The object according to claim 1, wherein
   the object base member coated with said carbon film is formed of a high polymer material.

3. The object according to claim 2, wherein said high polymer material is a rubber material and/or a resin material.

4. The object according to claim 3, wherein said carbon film is a diamond-like carbon film.

5. The object according to claim 2, wherein said carbon film is a diamond-like carbon film.

6. The object according to claim 2, wherein said carbon film is a diamond-like carbon film.

7. The object according to claim 1, wherein the pretreatment gas is at least one of a fluorine-containing gas, a hydrogen gas and an oxygen gas.

8. The object according to claim 1, wherein the object base member is a high polymer material fabricated from at least one of a rubber material or a resin material.

9. The object according to claim 8, wherein the rubber material is at least one of a natural rubber, butyl rubber, ethylene-propylene rubber, chloroprene rubber, chlorinated polyethylene rubber, epichlorohydrin rubber, acrylic rubber, nitrile rubber, urethane rubber, silicone rubber and fluororubber and the resin material is at least one of a thermoplastic resin, a thermosetting resin and a combination of a thermoplastic resin and a thermosetting resin.

10. An object to be in contact with a human's skin when used, comprising:
    an object base member having a film formation surface exposed to a pretreatment gas that cleans the film formation surface and enhances surface roughness for carbon film adhesion, the pretreated film formation surface coated with a carbon film adhering thereto and having a function of suppressing skin irritation, the carbon film having a friction coefficient of 1 or less and a film adhesion strength of at least 2 N, wherein the friction coefficient is measured with an aluminum pin having an end of 5 mm in radius, the pin being in contact with the carbon film under a load of 10 grams and moved at a weed of 20 mm per second,
    wherein said object to be in contact with the human's skin when used is a neck holder of a pulling treatment unit used for pulling treatment for a whiplash injury.

* * * * *